United States Patent [19]

Pigott

[11] Patent Number: 4,965,466
[45] Date of Patent: Oct. 23, 1990

[54] SUBSTRATE INJECTION CLAMP

[75] Inventor: John M. Pigott, Phoenix, Ariz.

[73] Assignee: Motorola, Inc., Schaumburg, Ill.

[21] Appl. No.: 381,871

[22] Filed: Jul. 19, 1989

[51] Int. Cl.$^5$ .......................... H03K 3/01; H03K 5/08
[52] U.S. Cl. ............................... 307/296.2; 307/296.4
[58] Field of Search ................... 307/296.2, 296.4, 540, 307/546

[56] References Cited

U.S. PATENT DOCUMENTS

| 4,577,211 | 3/1986 | Bynum et al. | 307/296.2 |
| 4,670,668 | 6/1987 | Liu | 307/592 |
| 4,794,278 | 12/1988 | Vajdic | 307/296.2 |
| 4,862,415 | 8/1989 | Nakano | 307/296.1 |

*Primary Examiner*—Stanley D. Miller
*Assistant Examiner*—Richard Roseen
*Attorney, Agent, or Firm*—Michael D. Bingham; Robert D. Atkins

[57] ABSTRACT

A substrate injection clamp uses a pre-existing NPN open-collector transistor to provide substrate protection for the parasitic diode formed between the collector of the transistor and the P-substrate of the IC. The NPN transistor is responsive to a control signal for rendering the transistor conductive and non-conductive. If a negative potential is applied to the collector, the NPN transistor operates in an inverse active mode, provided that the control signal is asserted, to source current from the emitter through the collector thereby clamping the voltage at the latter to a predetermined value less than the forward bias potential of the parasitic diode. If the control signal is not asserted, a circuit detects its absence and a provides a bias signal to the base to allow the NPN transistor to operate in the inverse active mode.

10 Claims, 1 Drawing Sheet

SUBSTRATE INJECTION CLAMP

BACKGROUND OF THE INVENTION

The present invention relates in general to the protection of integrated circuits (IC) and, more particularly, to a substrate injection clamp for preventing undesirable current injection into the P-substrate thereof.

The need for protecting the parasitic diode, formed between adjacent N-epitaxial (N-epi) and P-substrate regions, is well known and applicable to most if not all bipolar technologies. If a negative voltage is applied to the N-epi region, the parasitic diode could become forward biased injecting current into the P-substrate which could seriously degrade the performance of, or even destroy the IC.

One protection technique uses a separate clamping circuit coupled to the vulnerable N-epi region for limiting the voltage applied thereto. This technique is satisfactory for low current applications; however, the clamping circuit would require an unacceptably large die area to realize high current protection, e.g. above a few milliamps (mA).

Another technique, commonly known as a moat, increases the base channel spacing between the collector and emitter of the parasitic NPN transistor formed between two N-epi regions and the P-substrate thereby lowering the forward current transfer ratio thereof, typically to less than .001, and increasing the minimum current required for conduction through the parasitic diode. The moat technique imposes undesirable restrictions upon the geometric placement of the N-epi regions to ensure the low forward current transfer ratio.

Hence, there is a need for a high current substrate injection clamp requiring minimal die area and imposing no undue restrictions in the geometric layout of the IC.

SUMMARY OF THE INVENTION

It is therefore an objective of the present invention to provide an improved substrate injection clamp.

It is a further objective of the present invention to provide an improved substrate injection clamp for preventing the parasitic diode formed between an N-epi region and the P-substrate from conducting.

It is another objective of the present invention to provide an improved substrate injection clamp requiring minimal die area to realize the P-substrate injection prevention.

It is still another objective of the present invention to use a pre-existing high current transistor to provide the P-substrate protection.

In accordance with the above and other objectives there is provided a substrate injection clamp comprising a transistor responsive to a control signal, and a circuit responsive to a negative potential at the collector of the transistor for biasing the base thereof when the control signal is not asserted thereby enabling the transistor to operate in an inverse active mode.

DETAILED DESCRIPTION OF THE PREFERRED EMBODIMENT

Figure 1:
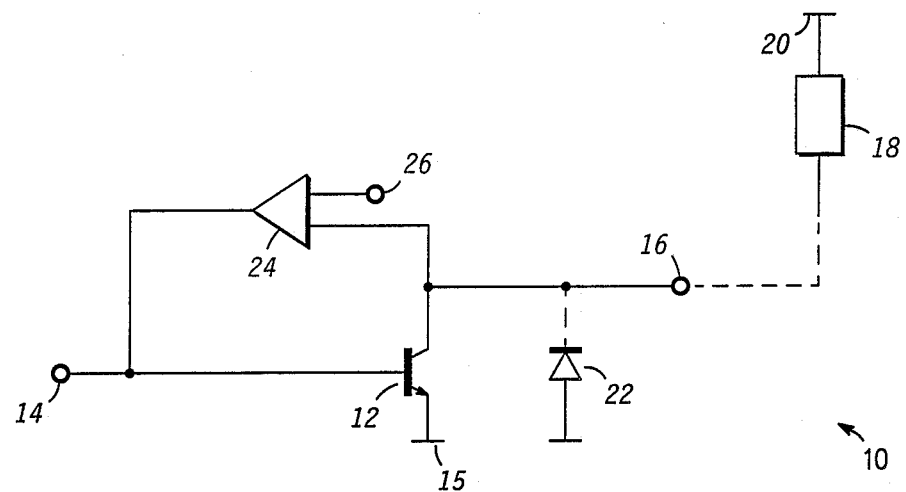
FIG. 1 illustrates a simplified diagram illustrating the preferred embodiment of the present invention.

Referring to FIG. 1, substrate injection clamp 10 may be realized within a monolithic integrated circuit using conventional integrated circuit processes. Substrate injection clamp 10 includes transistor 12 having a base coupled to input 14 and an emitter coupled to power supply conductor 15 which typically operates at ground potential. The collector of transistor 12 is coupled to output 16 forming a conventional open-collector driver circuit responsive to a control signal applied at input 14 for sinking relatively large currents therethrough. Load 18 is typically coupled between output 16 and power supply conductor 20 wherein the latter normally operates at a positive potential. In an automotive application, for example, load 18 may be an indicator lamp or a warning buzzer. Parasitic diode 22 is inherently formed between the collector of transistor 12 (formed in an N-epi region) and the P-substrate of the IC as is known.

Transistor 12 is a pre-existing functional component of the IC, that is, it operates as an electronic switch for turning on and off the current flowing through load 18. Unto itself, transistor 12 cannot prevent parasitic diode 22 from conducting; however, with additional circuitry, transistor 12 may serve a dual purpose; first as an electronic switch operating in the aforedescribed manner, and secondly as a current source for clamping the voltage at the collector thereof to a predetermined value smaller than the forward bias potential of parasitic diode 22.

Transistor 12 normally operates in forward active mode wherein current flows from the collector to the emitter. If the voltage at the collector becomes negative with respect to the emitter, and the base-collector junction is forward biased, transistor 12 may also operate in an inverse active mode wherein the current flows from the emitter to the collector. Thus, in the inverse active mode, transistor 12 sources current into output 16 to maintain the magnitude of the voltage thereat below the cutin potential of parasitic diode 22 preventing current injection into the P-substrate.

The aforementioned additional circuitry comprises comparator 24. The first and second inputs of comparator 24 are coupled to input 26 and to the collector of transistor 12 respectively. Comparator 24 compares the voltage at output 16 to a reference potential applied to input 26 the latter is typically set to −100 millivolts (mV). The reference potential of may be generated internal to comparator 24, hence, input 26 is not an essential feature. Notably, it is advisable to set the reference potential to a value less than zero to prevent possible false tripping of comparator 24.

Now assume that the control signal applied at input 14 is low, and the voltage at power supply conductor 20 is driven negative as could occur in an automotive application wherein the battery is connected backwards. Comparator 24 trips and asserts a high signal at the base of transistor 12 forcing the latter to turn on and operate in the inverse active mode sourcing current from power supply conductor 15 into output 16 clamping the voltage thereat. If the control signal is high, comparator 24 is deactivated since the control signal maintains transistor 12 in conduction and the collector voltage clamped to the saturation potential of the same. The control signal may be high or low at a given instance under external control. Should the control signal change state to a low level, comparator 24 would then activate and supply the bias signal to the base of transistor 12, as described above.

Figure 2:
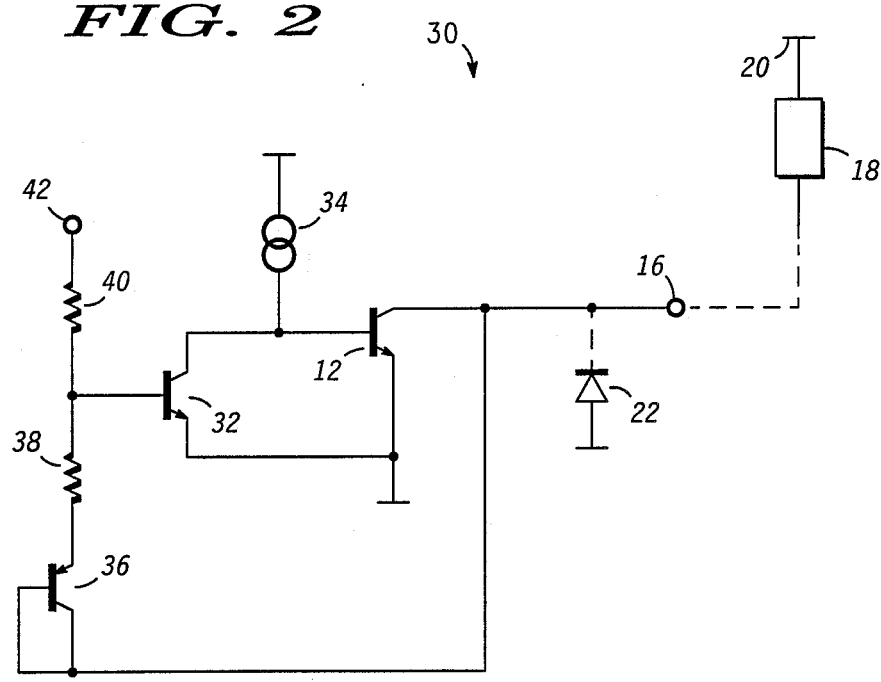
FIG. 2 illustrates the schematic diagram of an alternate embodiment of the present invention.

An alternate embodiment of the present invention is illustrated in FIG. 2. Substrate injection clamp 30 includes transistor 12 which is coupled in the aforedescribed manner of substrate injection clamp 10. The collector and emitter of transistor 32 are coupled to the base and emitter of transistor 12 respectively. Current supply 34 is also coupled to the base of transistor 12. Transistor 36 operates as a diode wherein its base and collector are coupled together to output 16. Resistor 38 is coupled between the base of transistor 32 and the emitter of transistor 36 while resistor 40 is coupled between input 42 and the base of transistor 32.

The operation of substrate injection clamp 30 proceeds as follows, first assuming a positive potential at power supply conductor 20. If a low control signal is applied to input 42, transistor 32 turns off allowing current supply 34 to supply bias current into the base of transistor 12 which turns the latter on enabling current to flow through its collector-emitter path and load 18. Conversely, a high signal applied to input 42 turns on transistor 32 which sinks the current flowing from current source 34 pulling the voltage at the base of transistor 12 low and turning the latter off. Transistor 36 is unbiased provided that the voltage at output 16 remains positive.

Now assume that a negative potential is applied at power supply conductor 20. If the control signal is low, transistor 12, which is already conducting, simply switches to the inverse active mode clamping the collector voltage to the negative saturation potential thereof. If the control signal is high, transistor 36 becomes forward biased pulling the voltage at the base of transistor 32 low turning it off and allowing current supply 34 to bias transistor 12 in the inverse active mode, again clamping the collector voltage to protect the parasitic diode. Resistor 38 may be selected to adjust the potential at output 16 at which transistor 38 becomes forward biased; preferably the trip point should be set to a negative value less than the forward bias potential of parasitic diode 22. Resistor 40 allows the voltage at the base of transistor 32 to be pulled low even through the control signal is high.

Hence, what has been described is a novel substrate injection clamp which provides substrate injection protection using a pre-existing transistor. The additional circuitry required to insure protection consumes minimal additional die area, and imposes no restriction on the geometric placement therein.

I claim:

1. A substrate injection clamp, comprising:
a transistor having a base, an emitter and a collector, said emitter being coupled to a source of operating potential, said base being responsive to a control signal wherein a non-assertive control signal renders said transistor non-conductive; and
means responsive to a negative potential applied at said collector when said control signal is non-assertive for biasing said base thereby enabling said transistor to operate in an inverse active mode.

2. A substrate protection circuit including a pre-existing first transistor having a base, a collector and an emitter coupled to a source of operating potential; and first means responsive to a control signal and coupled to the base of the first transistor for rendering the first transistor conductive and non-conductive; wherein the improvement comprises second means coupled between the collector of the first transistor and first means wherein said second means enables the first transistor to operate in an inverse active mode for sourcing current from the emitter through the collector to limit the voltage at the collector to a predetermined value wherein the use of a pre-existing first transistor substantially reduces the die area required to provide substrate injection projection.

3. The substrate protection circuit of claim 2 wherein said second means includes diode means coupled between the collector of the first transistor and the first means.

4. The substrate protection circuit of claim 3 wherein said second means further includes a first resistor coupled between said diode means and the first means.

5. The substrate protection circuit of claim 4 wherein said diode means includes a second transistor having a base and collector coupled together to the collector of the first transistor and an emitter coupled to said first resistor.

6. The substrate protection circuit of claim 5 wherein said second transistor is a PNP transistor.

7. The substrate protection circuit of claim 6 wherein the emitter of the first transistor is coupled to a source of operating potential.

8. The substrate protection circuit of claim 7 wherein the first means includes:
current supply means coupled to the base of the first transistor; and
a third transistor having a base, an emitter and a collector, said collector of said third transistor being coupled to the base of the first transistor, said emitter of said third transistor being coupled to said source of operating potential, said base of said third transistor being coupled to said first resistor and responsive to said control signal.

9. The substrate protection circuit of claim 8 wherein the first means further includes a second resistor coupled between said base of said third transistor and a terminal at which said control signal is applied.

10. A method of providing substrate protection as a negative potential occurs at a collector of a transistor disposed on the substrate, comprising the steps of:
applying a power supply voltage to an emitter of the transistor;
comparing the negative potential at the collector of the transistor to a reference potential;
applying a bias signal to a base of the transistor if the negative potential at the collector falls below said reference potential; and
activating the transistor in an inverse active mode for sourcing current from said emitter to the collector of the transistor for clamping the negative potential at the collector of the transistor to a predetermined value.

* * * * *